United States Patent
Weyer et al.

(10) Patent No.: US 12,261,606 B2
(45) Date of Patent: Mar. 25, 2025

(54) MEASURING PIN-TO-PIN DELAYS BETWEEN CLOCK ROUTES

(71) Applicant: Skyworks Solutions, Inc., Irvine, CA (US)

(72) Inventors: Daniel Weyer, Austin, TX (US); Raghunandan Kolar Ranganathan, Round Rock, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/212,088

(22) Filed: Jun. 20, 2023

(65) Prior Publication Data
US 2024/0030904 A1   Jan. 25, 2024

Related U.S. Application Data

(63) Continuation of application No. 17/697,052, filed on Mar. 17, 2022, now Pat. No. 11,728,799, which is a (Continued)

(51) Int. Cl.
*H03K 5/1534*   (2006.01)
*G04F 10/00*   (2006.01)
(Continued)

(52) U.S. Cl.
CPC ......... *H03K 5/1534* (2013.01); *G04F 10/005* (2013.01); *H03K 2005/00019* (2013.01); *H03L 7/08* (2013.01)

(58) Field of Classification Search
None
See application file for complete search history.

(56) References Cited

U.S. PATENT DOCUMENTS 6,993,109 B2 *  1/2006  Lee ............. H03L 7/0805
                                            327/158
9,077,386 B1 *  7/2015  Holden ............. H04L 25/028
(Continued)

FOREIGN PATENT DOCUMENTS

DE   102021111008 A1   11/2021
KR   2000-053958 A    9/2000

OTHER PUBLICATIONS

Datta, et al., "On-Chip Delay Measurement for Silicon Debug," ACM 2004, pp. 145-148.
(Continued)

*Primary Examiner* — Thomas J. Hiltunen
*Assistant Examiner* — Khareem E Almo
(74) *Attorney, Agent, or Firm* — Knobbe, Martens, Olson & Bear, LLP

(57) ABSTRACT

A delay measurement circuit includes a first skew circuit disposed proximate to a first bonding pad configured to receive a first clock signal having a first frequency. The delay measurement circuit includes a second skew circuit disposed proximate to a second bonding pad configured to receive a second clock signal having a second frequency. The first and second skew circuits each have a first mode of operation as zero-delay-return path and a second mode of operation as a synchronized pass path. The delay measurement circuit includes a pair of conductive traces coupled to the first skew circuit, another pair of conductive traces coupled to the second skew circuit, a time-to-digital converter circuit, and a switch circuit configured to selectively couple the time-to-digital converter circuit to the first skew circuit via the pair of conductive traces and the second skew circuit via the other pair of conductive traces.

20 Claims, 7 Drawing Sheets

Related U.S. Application Data continuation of application No. 16/717,816, filed on Dec. 17, 2019, now Pat. No. 11,283,437.

(51) Int. Cl.
  *H03K 5/00* (2006.01)
  *H03L 7/08* (2006.01)

(56) References Cited

U.S. PATENT DOCUMENTS

| | | | |
|---|---|---|---|
| 9,614,508 B1 * | 4/2017 | Bal | H03K 5/14 |
| 9,634,861 B2 | 4/2017 | Caffee | |
| 9,698,807 B1 | 7/2017 | Caffee et al. | |
| 9,804,573 B1 | 10/2017 | Drost et al. | |
| 10,067,478 B1 | 9/2018 | Ranganathan | |
| 10,594,329 B1 | 3/2020 | Eklholy | |
| 10,895,850 B1 | 1/2021 | Elkholy | |
| 11,082,048 B1 | 8/2021 | Satoh et al. | |
| 11,223,362 B2 | 1/2022 | Chiu et al. | |
| 11,283,437 B2 | 3/2022 | Weyer et al. | |
| 11,728,799 B2 | 8/2023 | Weyer et al. | |
| 11,774,915 B2 * | 10/2023 | Abdulaziz | H03L 7/087 327/159 |
| 2012/0200330 A1 * | 8/2012 | Kawagoe | H03K 5/133 716/122 |
| 2013/0058437 A1 | 3/2013 | Oshima et al. | |
| 2015/0145571 A1 | 5/2015 | Perrott | |
| 2016/0204781 A1 | 7/2016 | Plusquellic | |
| 2017/0187481 A1 | 6/2017 | Huang et al. | |
| 2020/0195255 A1 | 6/2020 | Fan et al. | |
| 2020/0379412 A1 | 12/2020 | Balakrishnan et al. | |
| 2021/0021272 A1 | 1/2021 | Karandikar et al. | |
| 2021/0184664 A1 | 6/2021 | Weyer et al. | |
| 2022/0082602 A1 | 3/2022 | Chou et al. | |
| 2022/0209760 A1 | 6/2022 | Weyer et al. | |

OTHER PUBLICATIONS

Ghosh, et al., "A Novel Delay Fault Testing Methodology Using Low-Overhead Built-In Delay Sensor," IEEE Transactions on Computer-Aided Design of Integrated Circuits and Systems, vol. 25, No. 12, Dec. 2006, pp. 2934-2943.

Katoh, et al., "A Low Area On-Chip Delay Measurement System Using Embedded Delay Measurement Circuit," 2010 19th IEEE Asian Test Symposium, pp. 343-348.

Pei, et al., "A Low Overhead On-Chip Path Delay Measurement Circuit," 2009 Asian Test Symposium, IEEE Computer Society, pp. 145-150.

Su, et al., "All Digital Built-in Delay and Crosstalk Measurement for On-Chip Buses," IEEE Proceedings Design, Automation and Test | Europe Conference and Exhibition, Mar. 27-30, 2000, 5 pages.

\* cited by examiner

MEASURING PIN-TO-PIN DELAYS BETWEEN CLOCK ROUTES

CROSS-REFERENCE TO RELATED APPLICATION(S)

This application is a continuation of U.S. patent Ser. No. 17/697,052, filed Mar. 17, 2022, entitled "Measuring Pin-To-Pin Delays Between Clock Routes," which is a continuation of U.S. patent application Ser. No. 16/717,816, filed Dec. 17, 2019, entitled "Measuring Pin-to-Pin Delays Between Clock Routes," naming Daniel Weyer and Raghunandan Kolar Ranganathan as inventors, which application is incorporated herein by reference in its entirety.

BACKGROUND

Field of the Invention

This disclosure is related to integrated circuits and more particularly to clock signals of integrated circuits.

Description of the Related Art

Phase-locked loops are used in network synchronization applications to generate output clock signals that are synchronized to input reference clock signals. A phase-locked loop is a feedback system that aligns signal edges of a reference clock signal and signal edges of a feedback clock signal, synchronizing the frequency and phase of both clock signals. Since the phase of the feedback clock signal tracks the phase of the reference clock signal, the phase of the output clock signal is synchronized to the phase of the reference clock signal. In an exemplary phase-locked loop, the delay of the feedback divider of the phase-locked loop is known. Thus, the time delay between the signal edges of the reference clock signal and the output clock signal is known.

Due to clock redundancy and clock distribution requirements in an exemplary network synchronization application, associated timing products have a substantial number of input clock signals and output clock signals and allow for different clock signal formats. In addition, timing products typically provide flexibility in terms of input clock frequencies and output clock frequencies. To provide these features, peripheral circuits are added at the reference input and at the output of the phase-locked loop (e.g., switches or multiplexers, configurable I/O buffers, and input or output frequency dividers). These additional circuits increase the delay of the corresponding clock paths, thus adding to the known (i.e., deterministic) delay of the phase-locked loop. The input and output clock signals are subject to different route delays on a printed circuit board.

Pin-to-pin delays (e.g., input-to-input (I-I), input-to-output (I-O), or output-to-output (O-O) delays) are critical specifications for synchronization of signals in communications networks. Aggressive delay budgets necessitate system level calibration to compensate for various sources of delay, including delays through printed circuit board traces and buffers. Thus, techniques for measuring and quantifying pin-to-pin delays on printed circuit boards are desired.

SUMMARY OF EMBODIMENTS OF THE INVENTION

In at least one embodiment, a delay measurement circuit for measuring delays between signal routes of an integrated circuit includes a first skew circuit disposed proximate to a first bonding pad configured to receive a first clock signal having a first frequency. The delay measurement circuit includes a second skew circuit disposed proximate to a second bonding pad configured to receive a second clock signal having a second frequency. The second frequency is integrally related to the first frequency. The first skew circuit and the second skew circuit each have a first mode of operation as zero-delay-return path and a second mode of operation as a synchronized pass path. The delay measurement circuit includes a first pair of conductive traces coupled to the first skew circuit, a second pair of conductive traces coupled to the second skew circuit, a time-to-digital converter circuit, and a switch circuit configured to selectively couple the time-to-digital converter circuit to the first skew circuit via the first pair of conductive traces and the second skew circuit via the second pair of conductive traces.

A method for calibrating a clock signal includes generating a first skew code and a second skew code. The first skew code is indicative of a first delay of a first conductive path coupled between a first bonding pad of an integrated circuit die and a time-to-digital converter circuit and the second skew code is indicative of a second delay of a second conductive path coupled between a second bonding pad of the integrated circuit die and the time-to-digital converter circuit. The method includes generating a first time code and a second time code. The first time code corresponds to a first signal edge of a first clock signal received by the first bonding pad and the second time code corresponds to a second signal edge of a second clock signal received by the second bonding pad.

A delay measurement circuit for measuring delays between signal routes of an integrated circuit includes a storage element configured to store instructions and a control circuit configured to execute the instructions to cause the control circuit to generate a delay code based on a first time code corresponding to a first signal edge of a first clock signal received by a first bonding pad of the integrated circuit, a second time code corresponding to a second signal edge of a second clock signal received by a second bonding pad of the integrated circuit, a first skew code, a second skew code, and a period of the first clock signal or the second clock signal. The first skew code is indicative of a first delay of a first conductive path coupled between the first bonding pad and a time-to-digital converter circuit. The second skew code is indicative of a second delay of a second conductive path coupled between the second bonding pad and the time-to-digital converter circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique for estimating route delays on a printed circuit board including an integrated circuit product measures pin-to-pin delays by the integrated circuit product without requiring additional circuitry. The technique accounts for routing mismatches of the integrated circuit product, thereby improving the estimation as compared to other techniques. The delay estimate may be used to adjust clock delays to reduce pin-to-pin delays or other clock latencies. The delay measurement technique is applicable to measuring the delay between input clock signals, output clock signals, input-to-output pairs (e.g., pin-to-pin delay between two input clock signals (input-to-input delay), two output clock signals (output-to-output delay) or an input clock signal and an output clock signal (input-to-output delay)), clock signals of internal nodes of an integrated circuit, or combinations thereof.

Figure 1:
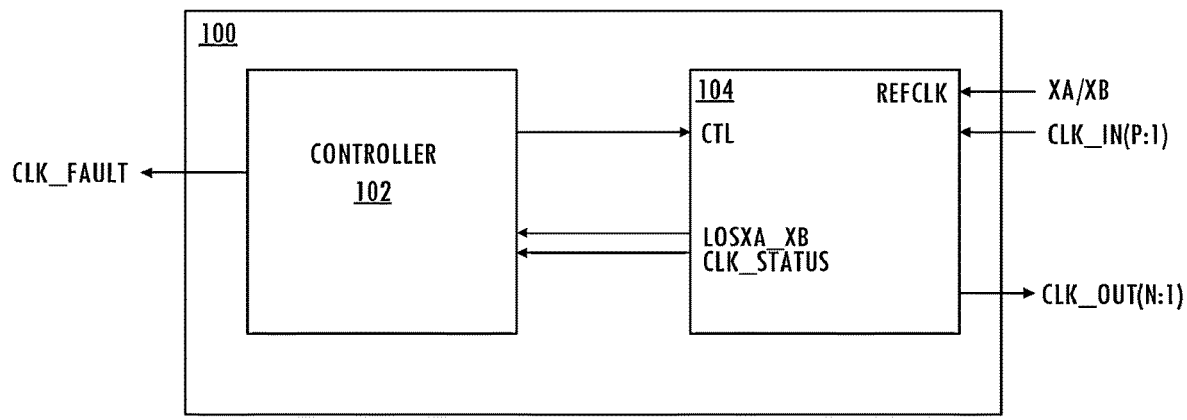
FIG. 1 illustrates a functional block diagram of an exemplary clock product.

Referring to FIG. 1, an embodiment of clock product 100 includes controller 102 and clock generator 104, which monitors at least one received clock signal (e.g., CLK_IN (P:1)) using clock signal REFCLK (e.g., a clock signal generated using a crystal oscillator including an external crystal coupled to XA/XB input terminal) and provides at least one output clock signal CLK_OUT(N:1) and at least one clock quality signal, where P and N are integers greater than zero. Controller 102 provides configuration information to clock generator 104 using interface signals CTL. Clock generator 104 provides clock quality information (e.g., LOSXA_XB or CLK_STATUS) to controller 102, which outputs one or more alarm signals (e.g., CLK_FAULT) based on the clock quality information.

Figure 2:
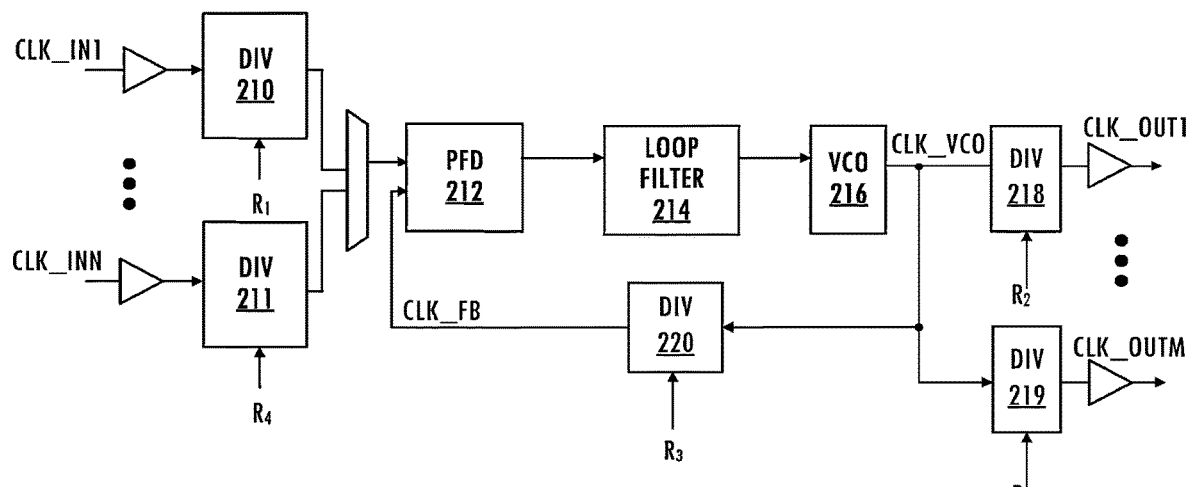
FIG. 2 illustrates a functional block diagram of an exemplary clock generator circuit.

Referring to FIG. 2, an exemplary clock generator includes an analog phase-locked loop and frequency dividers for generating a reference clock signal and a feedback clock signal at target frequencies. The analog phase-locked loop includes phase/frequency detector 212, which receives a reference clock signal selected from outputs of N frequency dividers (e.g., frequency divider 210 or frequency divider 211), loop filter 214, and voltage-controlled oscillator 216. Frequency divider 210 and frequency divider 211 frequency-divide input clock signal CLK_IN1 and CLKINN, respectively. Frequency divider 220, frequency divider 218, and frequency divider 219 divide the frequency of clock signal CLK_VCO to generate feedback clock signal CLK_FB, output clock signal CLK_OUT1, and output clock signal CLK_OUTM, respectively, at target frequencies.

Figure 3:
FIG. 3 illustrates exemplary waveforms for input-to-input pin delays and input-to-output pin delays.
Figure 4:
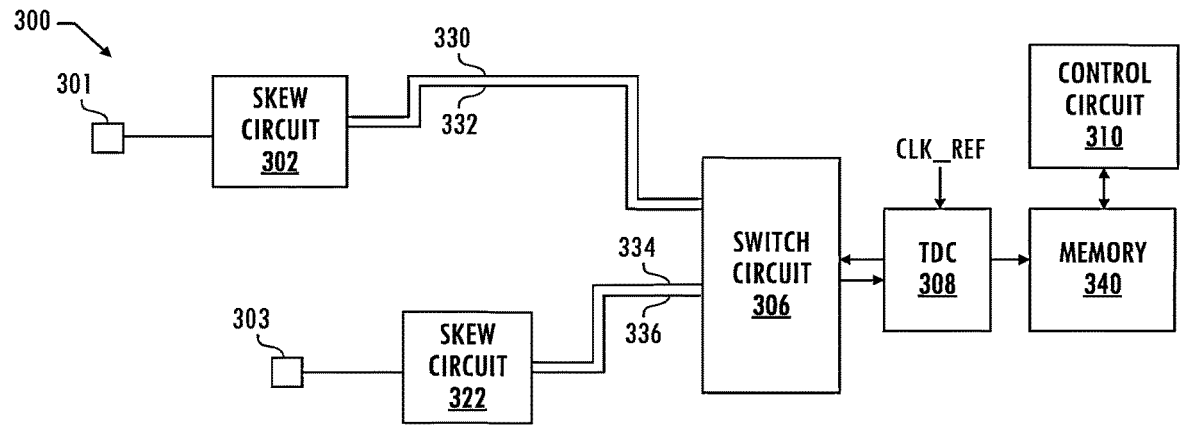
FIG. 4 illustrates a functional block diagram of an exemplary delay measurement circuit consistent with at least one embodiment of the invention.

Referring to FIG. 3, an input-to-input pin delay of any two input clock signals of input clock signals CLK_IN(1:N), e.g., clock signal CLK_INA and clock signal CLK_INB, is delay $\Delta t_{IN}$ and the input-to-output pin delay of any input clock signal CLK_IN(1:N) and any output clock signal of output clock signals CLK_OUT(1:M), e.g., clock signal CLK_INA and clock signal CLK_OUTB, is delay $\Delta t_{OUT}$. An exemplary circuit for measuring those delays is illustrated in FIG. 4. In at least one embodiment, delay measurement circuit 300 measures pin-to-pin delays of clock signals communicated by bonding pads that are selectively coupled to time-to-digital converter circuit 308. Bonding pad 301 and bonding pad 303 are exemplary integrated circuit bonding pads. In at least one embodiment, bonding pad 301 and bonding pad 303 each include, or are coupled to, electrostatic discharge circuitry (not shown, e.g., diodes) and a pin or other integrated circuit product terminal. Design of matched routing between multiple bonding pads and a time-to-digital converter on an integrated circuit is challenging for layout design and may not be feasible under some circumstances. Rather than matching the routing for multiple paths to reduce error in delay estimates, the delay measurement technique matches pairs of traces of a conductive path between a bonding pad and switch circuit 306. For example, conductive traces 330 and 332 are matched and are laid out proximate to each other to result in a negligible amount of mismatch. Conductive traces 334 and 336 are matched and are laid out proximate to each other to result in a negligible amount of mismatch. However, conductive traces 330 and 332 are not necessarily matched or laid out proximate to conductive traces 334 and 336.

In at least one embodiment of delay measurement circuit 300, skew circuit 302 and skew circuit 322 are disposed at, or proximate to, bonding pads 301 and 303, respectively, so that any routing between bonding pad 301 or 303 and its corresponding skew circuit is negligible. Switch circuit 306 is configured to enable delay measurements for bonding pads that are associated with different routing paths between the bonding pad and time-to-digital converter circuit 308. Control circuit 310 configures delay measurement circuit 300 to perform delay measurements in two steps to account for on-chip routing mismatch between conductive trace pairs. In at least one embodiment, control circuit 310 includes a microcontroller, microprocessor, or other processing circuit configured to execute instructions stored in memory 340. In at least one embodiment, control circuit 310 is a finite state machine configured to cause delay measurement circuit 300 to perform the delay measurement techniques described herein.

Figure 5:
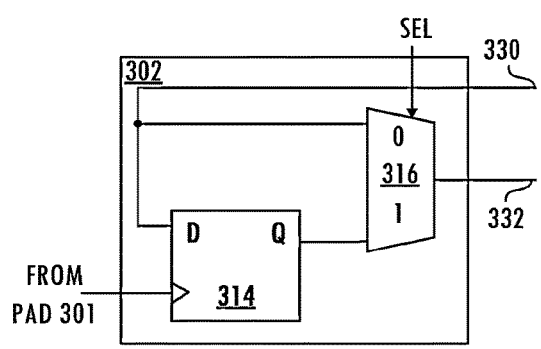
FIG. 5 illustrates a functional block diagram of an exemplary skew circuit consistent with at least one embodiment of the invention.
Figure 6:
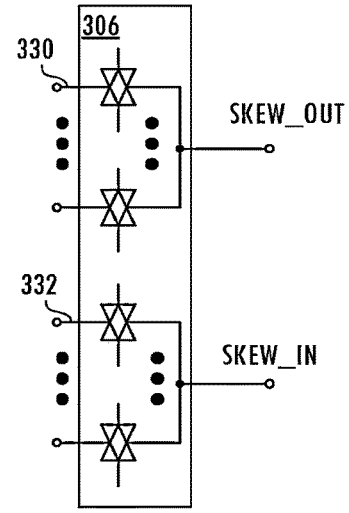
FIG. 6 illustrates a functional block diagram of an exemplary switch circuit consistent with at least one embodiment of the invention.

Referring to FIGS. 4 and 5, in at least one embodiment of delay measurement circuit 300, a skew circuit includes D-flip-flop 314 and 2-to-1 multiplexer circuit 316. In some embodiments, the skew circuit includes additional flip-flops cascaded with D-flip flop 314 to reduce or eliminate metastable events. Each skew circuit is operable in two modes. In a first mode (e.g., control signal SEL has a low signal level), skew circuit 302 is configured as a zero-delay-return path that promptly returns, via conductive trace 332, a signal received from switch circuit 306 via conductive trace 330, and introduces, at most, a negligible delay in skew circuit 302. This mode is used for a time delay (i.e., skew) measurement of the first step. In a second mode (e.g., control signal SEL has a high signal level), skew circuit 302 is configured as a synchronized-pass path that passes a signal edge to switch circuit 306, via conductive trace 332, in response to receiving a signal edge from bonding pad 301. This mode is used for a time measurement of the second step. Referring to FIGS. 4 and 6, in at least one embodiment, switch circuit 306 is implemented as a 2N×2 switch based on transmission gates, where N is the number of bonding pads. Switch circuit 306 couples the SKEW_OUT/SKEW_IN nodes of time-to-digital converter circuit 308 to only one pair of conductive traces of N pairs of conductive traces at a time.

Figure 7:
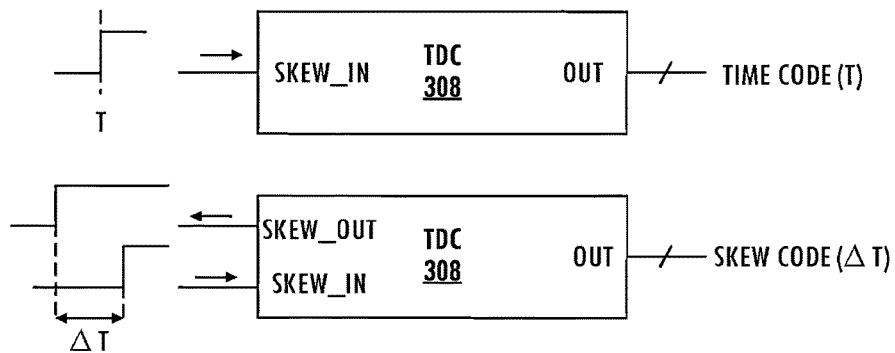
FIG. 7 illustrates functional block diagrams of a first mode and a second mode of an exemplary time-to-digital converter circuit consistent with at least one embodiment of the invention.

Referring to FIGS. 4 and 7, time-to-digital converter circuit 308 has two modes of operation. In a first mode of operation, delay measurement circuit 300 configures time-to-digital converter circuit 308 in a skew mode that is used to estimate a routing mismatch between the two nodes for which a pin-to-pin delay is to be measured. In the skew mode, time-to-digital converter circuit 308 performs a relative time measurement. Time-to-digital converter circuit 308 generates a signal edge (e.g., a rising signal edge) at a dedicated output node (e.g., node SKEW_OUT) that is communicated via a conductive trace of a pair of conductive traces, and receives a returning version of that signal edge via the other conductive trace of the pair of conductive traces at a dedicated input node (e.g., node SKEW_IN). Time-to-digital converter circuit 308 converts the time delay between those events (e.g., the outgoing rising signal edge and the received version of that rising signal edge) into a skew code, i.e., a digital value that represents the time delay between the outgoing signal edge and the returning signal edge. A signal edge provided via node SKEW_OUT arms time-to-digital converter circuit 308 to generate a skew code (ΔT) on the digital code output of time-to-digital converter circuit 308 in response to a next received signal edge on node SKEW_IN. The pairs of conductive traces coupled between the skew circuits and switch circuit 306 include one trace that delivers a signal edge from the time-to-digital converter circuit 308 to the skew circuit and another trace for the signal to return to node SKEW_IN of time-to-digital converter circuit 308. Switch circuit 306 couples node SKEW_OUT of time-to-digital converter circuit 308 to a selected skew circuit and delivers a signal edge generated at node SKEW_OUT to that skew circuit. The skew circuit is configured as a zero-delay-return path that promptly returns the signal edge to switch circuit 306, which delivers the signal edge to node SKEW_IN of time-to-digital converter circuit 308. Time-to-digital converter circuit 308 captures the time delay (i.e., skew) between the signal edges at node SKEW_OUT and node SKEW_IN, thereby generating a digital code indicative of twice the delay of a conductive trace between a skew circuit and time-to-digital converter circuit 308.

In a second mode of operation, delay measurement circuit 300 configures time-to-digital converter circuit 308 in a timestamping mode. In the timestamping mode, time-to-digital converter circuit 308 performs absolute time measurements. For example, time-to-digital converter circuit 308 sends a signal edge from node SKEW_OUT to switch circuit 306. If time-to-digital converter 308 detects a clock edge at its input (e.g., a rising signal edge at node SKEW_IN), time-to-digital converter 308 uses a reference clock signal (e.g., clock signal CLK_REF) to generate time code (T), i.e., a digital value that corresponds to the point in time that the input event occurred. Meanwhile, the skew circuits are configured as synchronized-pass paths, as described above. In this configuration, if a selected skew circuit previously received the signal edge from node SKEW_OUT of time-to-digital converter circuit 308, the selected skew circuit passes a signal edge received at a corresponding bonding pad to the switch circuit 306 via the conductive trace coupled to node SKEW_IN. The digital code output by time-to-digital converter 308 is indicative of the absolute time that a signal edge received on the bonding pad is received at time-to-digital converter 308.

In at least one embodiment, time-to-digital converter circuit 308 includes an $M_1$-bit coarse time-to-digital converter implemented using a ripple counter circuit and an $M_2$-bit fine time-to-digital converter (e.g., a delay-locked loop time-to-digital converter using a flash analog-to-digital converter circuit, a track-and hold circuit followed by a successive approximation register analog-to-digital converter circuit, or combinations thereof), where $M_1$ and $M_2$ are integers greater than zero. In at least one embodiment, time-to-digital converter circuit 308 is implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference. In at least one embodiment, time-to-digital converter circuit 308 is implemented using techniques described in U.S. Pat. No. 9,804,573, issued Oct. 31, 2017, entitled "Use of Redundancy in Sub-Ranging Time-to-Digital Converters to Eliminate Offset Mismatch Issues," naming Brian G. Drost and Ankur G. Roy as inventors, which application is incorporated herein by reference. However, other time-to-digital converters and techniques for implementing coarse or fine time-to-digital converter circuits may be used.

Figure 8:
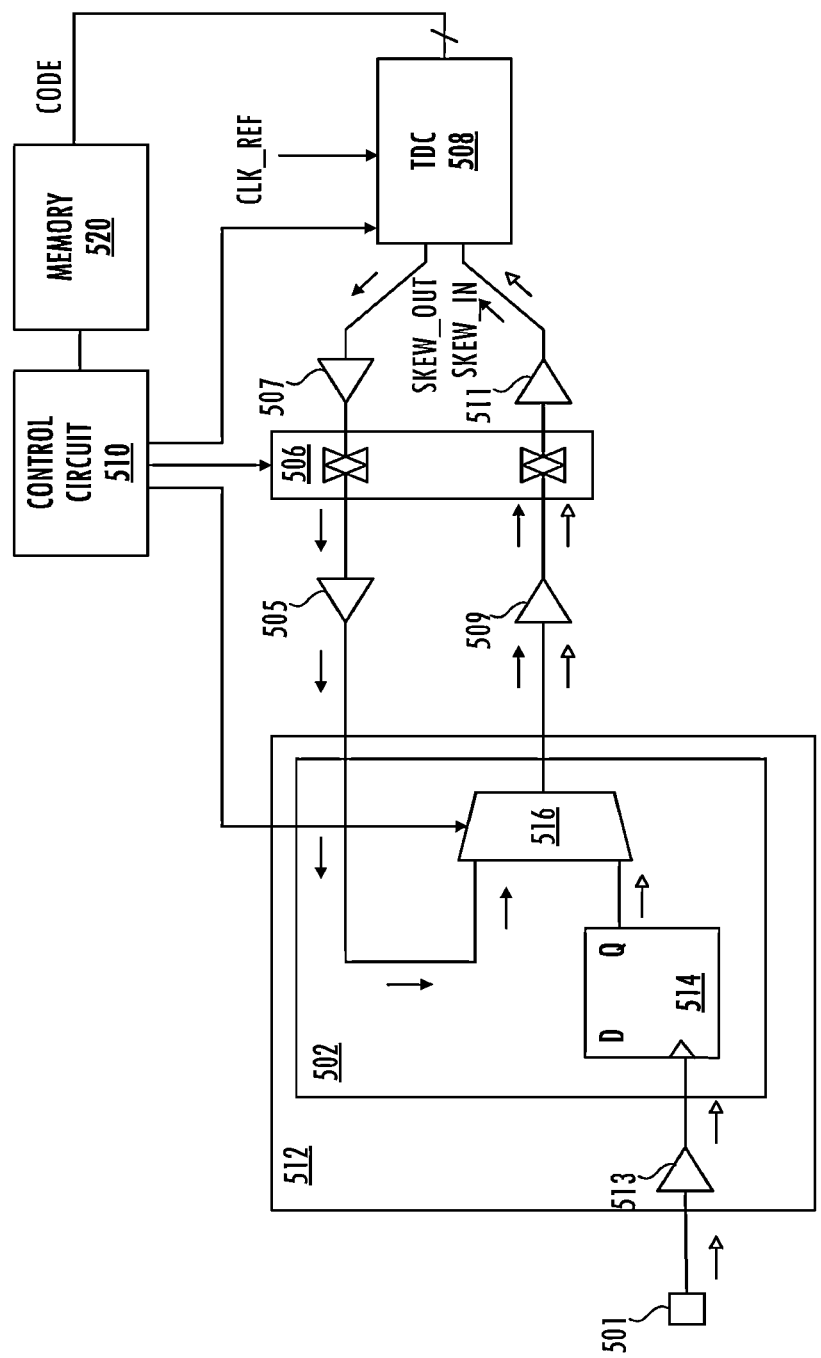
FIG. 8 illustrates a signal flow in a first mode of operation of the delay measurement circuit of FIG. 4 and a signal flow in a second mode of operation of the delay measurement circuit of FIG. 4 consistent with at least one embodiment of the invention.

FIG. 8 illustrates exemplary signal paths for the first mode of operating a delay measurement circuit consistent with the disclosure herein that generates skew codes and the signal paths for the second mode of operating the delay measurement circuit that generates time codes. The first mode that generates skew codes is indicated by filled arrowheads and the second mode that generates time codes is indicated by open arrowheads. Bonding pad 501 may be an input bonding pad or an output bonding pad coupled to skew circuit 502. In at least one embodiment, skew circuit 512 includes input buffer 513. The skew code of bonding pad 501 accounts for the delay of a signal starting at node SKEW_OUT of time-to-digital converter circuit 508, through refresh buffer 507, refresh buffer 505, refresh buffer 509, refresh buffer 511, twice the delay of select circuit 506, and any routing delay of conductive traces therebetween. In this configuration, any delay through multiplexer circuit 516 is negligible. The time code for bonding pad 501 accounts for the delay of input buffer 513, state element 514, refresh buffer 509, select circuit 506, refresh buffer 511, and conductive traces therebetween. In this configuration, any delay through multiplexer circuit 516 is negligible. The path between bonding pad 501 and time-to-digital converter circuit 508 includes delays that are common mode with respect to another path between another bonding pad and time-to-digital converter circuit 508. For example, the delay of input buffer 513, state element 514, multiplexer circuit 516, and select circuit 506 are common mode delays in some embodiments. In addition, any delay between select circuit 506 and time-to-digital converter 508 (e.g., refresh buffer 507 and refresh buffer 511) is a common mode delay. When subtracting skew codes associated with bonding pad 501 from the skew code associated with another bonding pad, common mode delays associated with those bonding pads cancel each other, leaving only the difference in delays between those paths between distinct bonding pads and time-to-digital converter circuit 508. Controller 510 generates control signals for the first mode or the second mode and stores digital code outputs from time-to-digital converter 508 in memory 520.

Figure 9:
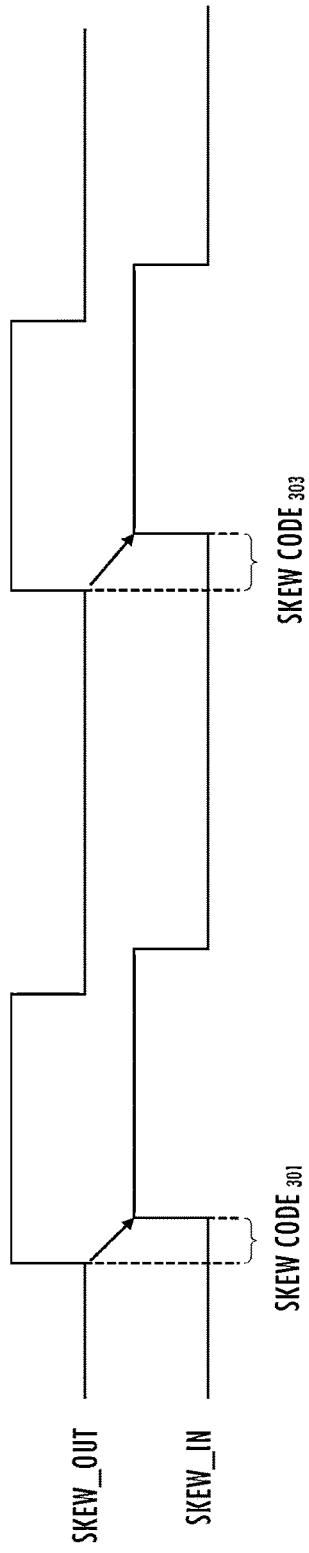
FIG. 9 illustrates exemplary waveforms for the delay measurement circuit of FIG. 4 configured in a first mode consistent with at least one embodiment of the invention.

Referring to FIGS. 4 and 9, in at least one embodiment of delay measurement circuit 300, in the first mode of operation, control circuit 310 configures each skew circuit to provide a zero-delay-return path, as described above, time-to-digital converter circuit 308 in the skew mode, as described above, and time-to-digital converter circuit 308 to generate skew codes for consecutively selected bonding pads (e.g., bonding pad 301 and bonding pad 303). Control circuit 310 causes switch circuit 306 to sequentially couple each bonding pad to time-to-digital converter circuit 308 for a skew measurement. The trace delay difference between conductive paths associated with bonding pad 301 and bonding pad 303 is (skew $code_{301}$–skew $code_{303}$)/2, where skew $code_{303}$=2×trace delay associated with bonding pad 303 and skew $code_{301}$=2×trace delay associated with bonding pad 301.

In at least one embodiment, time-to-digital converter circuit 308 has a predetermined operating range that detects delays between a minimum delay value and a maximum delay value. However, the delay between the signal edge at node SKEW_OUT and the signal edge at node SKEW_IN can be outside the predetermined operating range of time-to-digital converter circuit 308 since the traces have arbitrary lengths. In at least one embodiment, time-to-digital converter circuit 308 is configurable to handle arbitrary trace delays that are outside of a predetermined operating range of time-to-digital converter circuit 308. Rather than generating a single signal edge at node SKEW_OUT, time-to-digital converter circuit 308 uses a finite-state machine to generate multiple pulses separated by period $T_{PER}$ at node SKEW_OUT and to select an index of the pulse at node SKEW_IN. This technique adjusts the effective pulse width to be within the range of time-to-digital converter circuit 308. Control circuit 310 removes the corresponding adjustment values when computing the trace delay.

Figure 10:
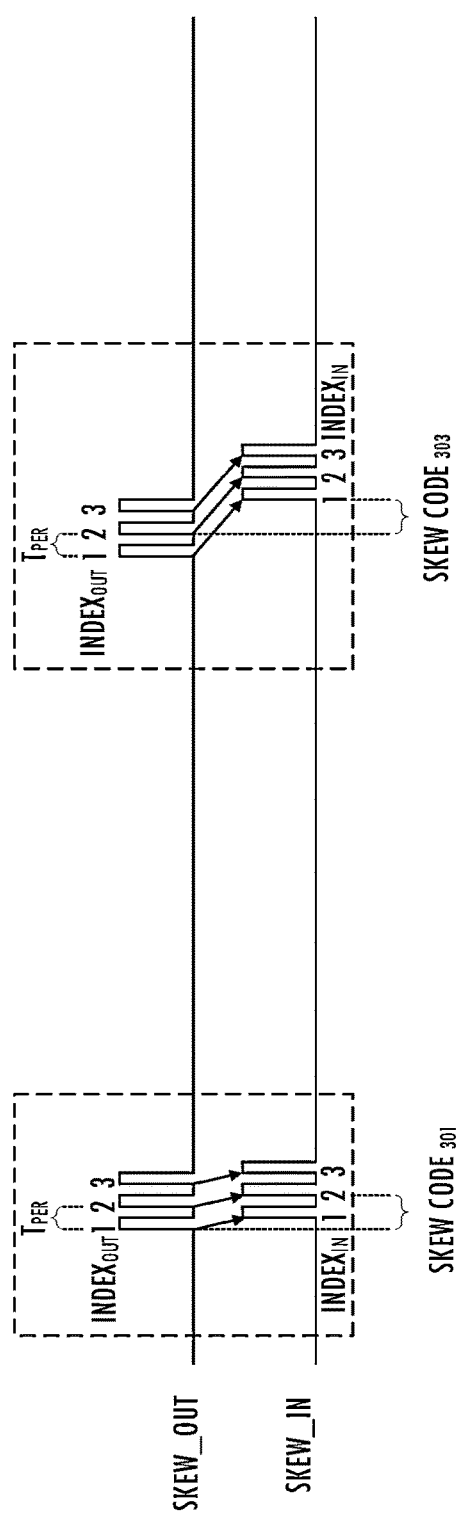
FIG. 10 illustrates exemplary waveforms for the delay measurement circuit of FIG. 4 with an adjustable pulse width to fit within the range of the time-to-digital converter circuit consistent with at least one embodiment of the invention.

For example, referring to FIGS. 4 and 10, time-to-digital converter circuit 308 generates three pulses at node SKEW_OUT and selects indices of the output signal edge at node SKEW_OUT and the return signal edge at node SKEW_IN (e.g., $INDEX_{OUT}$=1 and $INDEX_{IN}$=2) for use in generating corresponding skew signals. If time-to-digital converter circuit 308 is coupled to trace 330 and trace 332 having a delay that is much less than the range of time-to-digital converter circuit 308 (i.e., the delay is relatively small), then time-to-digital converter circuit 308 selects indices that effectively add period $T_{PER}$ to the signal edge at node SKEW_IN, e.g., $INDEX_{OUT}$=1 and $INDEX_{IN}$=2:

$$\text{skew code}_{301} = 2 \times \text{trace delay}_{301} + (\text{INDEX}_{IN} - \text{INDEX}_{OUT}) \times T_{PER}$$
$$= 2 \times \text{trace delay}_{301} + T_{PER}.$$

If time-to-digital converter circuit 308 is coupled to trace 334 and trace 336 having a delay that is much greater than the range of time-to-digital converter circuit 308 (i.e., the delay is relatively large), then time-to-digital converter circuit 308 selects indices that effectively subtract period $T_{PER}$ from the signal edge at node SKEW_IN, e.g., and $INDEX_{OUT}$=2 and $INDEX_{IN}$=1:

$$\text{skew code}_{303} = 2 \times \text{trace delay}_{303} + (\text{INDEX}_{IN} - \text{INDEX}_{OUT}) \times T_{PER}$$
$$= 2 \times \text{trace delay}_{303} - T_{PER}.$$

When computing the trace delay difference between conductive paths associated with bonding pad 301 and bonding pad 303, delay measurement circuit 300 adjusts skew $code_{301}$ by subtracting $T_{PER}$ and adjusts skew $code_{303}$ by adding $T_{PER}$. The resulting difference divided by two is the delay between conductive paths associated with bonding pad 301 and bonding pad 303:

$$((\text{skew code}_{301} - T_{PER}) - (\text{skew code}_{303} + T_{PER}))/2.$$

Note that other numbers of pulses may be used.

Figure 11:
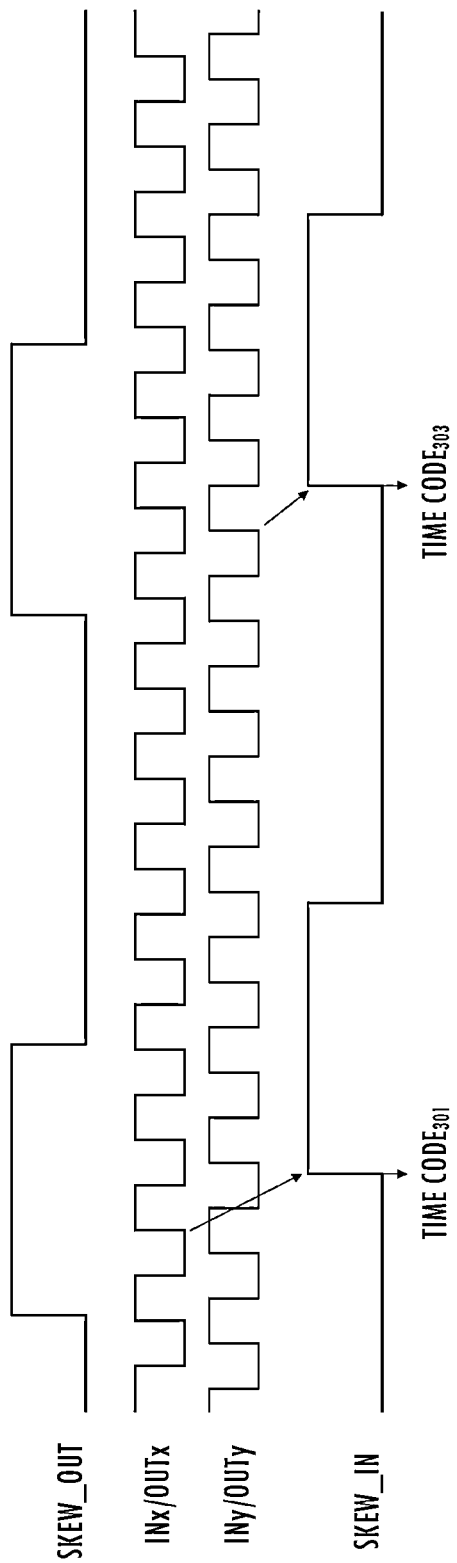
FIG. 11 illustrates exemplary waveforms for the delay measurement circuit of FIG. 4 configured in a second mode consistent with at least one embodiment of the invention.

Referring to FIGS. 4 and 11, in at least one embodiment, in the second mode of operation, delay measurement circuit 300 uses signals received on each bonding pad that are the same frequency or integrally related in frequency. Control circuit 310 configures the skew circuits to provide synchronized-pass paths. Control circuit 310 causes switch circuit 306 to sequentially couple corresponding skew circuits to time-to-digital converter circuit 308 for two consecutive time measurements. Control circuit 310 configures time-to-digital converter circuit 308 in the timestamping mode and to perform two consecutive absolute time measurements: one absolute time measurement for an event at each bonding pad (e.g., a rising signal edge at the bonding pad that is captured by time-to-digital converter circuit 308). Each digital time measurement value (e.g., time code 301 and time code 303) includes the trace delays between the respective skew circuit and switch circuit 306. Control circuit 310 processes the two digital time codes (e.g., time code 301 and time code 303) to quantify the input-to-input, input-to-output, or output-to-output delay.

Control circuit 310 generates the input-to-input, input-to-output, or output-to-output delay using the skew codes, time codes, and the signal period information as follows:

$$(\text{time code}_{303} - \text{time code}_{301}) \bmod (\min(\text{period}_{301}, \text{period}_{303})) - \text{trace delay difference},$$

where the trace delay difference is (skew $code_{303}$–skew $code_{301}$)/2, $period_{301}$ is the period of the clock signal received by bonding pad 301 in the second mode, and $period_{303}$ is the period of the clock signal received by bonding pad 301 in the second mode.

Figure 12:
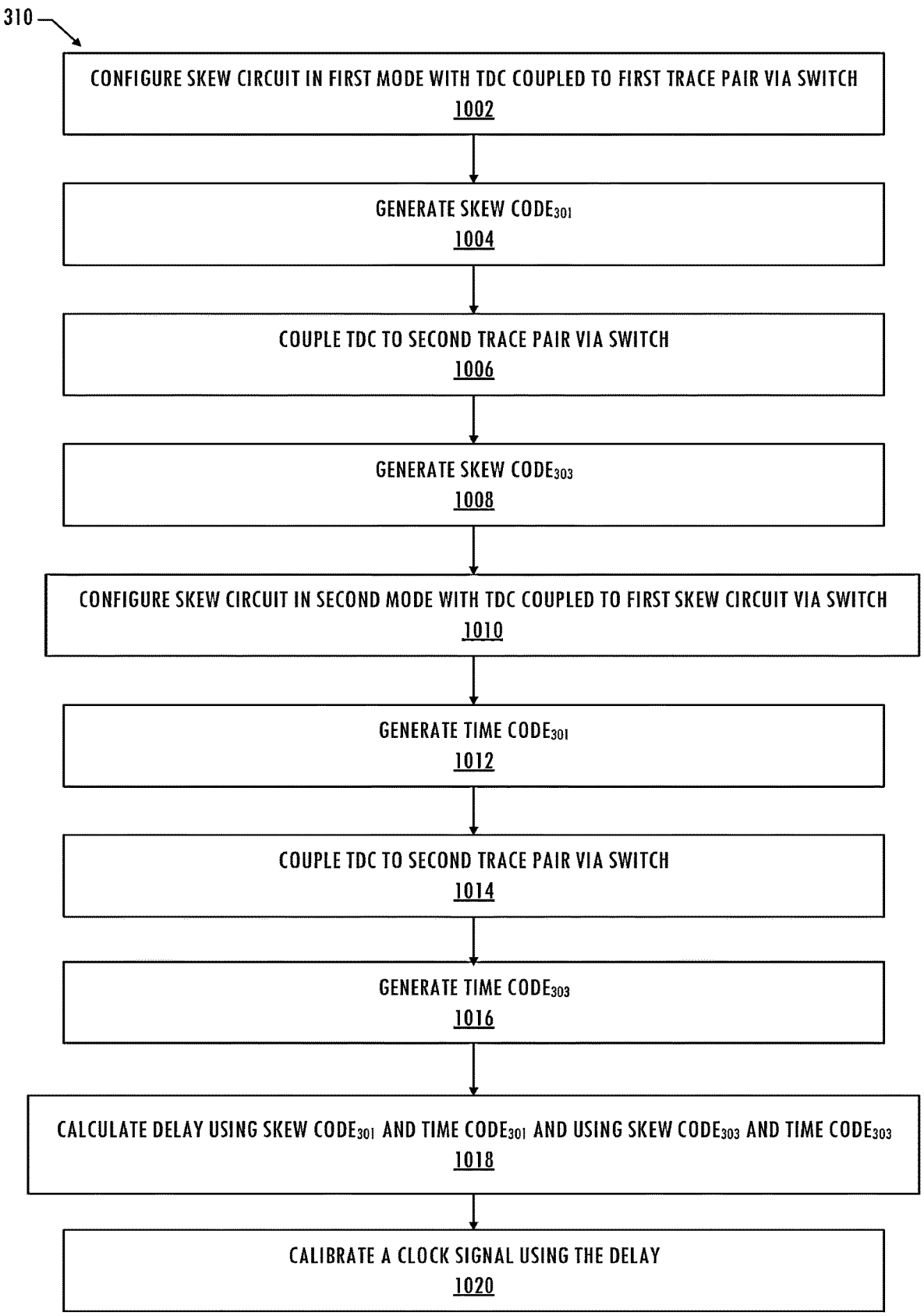
FIG. 12 illustrates an exemplary information and control flow of the delay measurement circuit of FIG. 4 consistent with at least one embodiment of the invention.

Referring to FIGS. 4 and 12, in at least one embodiment of delay measurement circuit 300, control circuit 310 configures paths associated with bonding pad 301 and bonding pad 303 to estimate a pin-to-pin delay between bonding pad 301 and bonding pad 303. Control circuit 310 configures delay measurement circuit 300 in the first mode, which includes configuring skew circuits 302 and 322 for zero-delay return paths and coupling time-to-digital converter circuit 308 to trace 330 and trace 332 via switch circuit 306

(1002). Control circuit 310 configures time-to-digital converter circuit 308 to generate a signal edge on node SKEW_OUT and to generate skew code$_{301}$ in response to receiving that signal edge by time-to-digital converter circuit 308 on node SKEW_IN (1004). Next, control circuit 310 couples time-to-digital converter circuit 308 to trace 334 and trace 336 via switch circuit 306 (1006). Then, control circuit 310 configures time-to-digital converter circuit 308 to generate a signal edge on node SKEW_OUT and to generate skew code$_{303}$ in response to receiving that signal edge by time-to-digital converter circuit 308 on node SKEW_IN (1008).

Next, control circuit 310 configures delay measurement circuit 300 in the second mode, which includes configuring skew circuits 302 and 304 as synchronized pass paths responsive to a signal on node SKEW_OUT and some embodiments include coupling time-to-digital converter circuit 308 to trace 330 and trace 332 via switch circuit 306 (1010). Control circuit 310 configures time-to-digital converter circuit 308 to generate a signal edge on node SKEW_OUT and time code$_{301}$ in response to receiving a signal edge from bonding pad 301 on node SKEW_IN (1012). Then, control circuit 310 couples time-to-digital converter circuit 308 to trace 334 and trace 336 via switch circuit 306 (1014). Control circuit 310 configures time-to-digital converter circuit 308 to generate a signal edge on node SKEW_OUT and time code$_{303}$ receiving a signal edge from bonding pad 303 on node SKEW_IN (1016). Next, control circuit 310 calculates a delay between bonding pad 301 and bonding pad 303 using skew code$_{301}$, time code$_{301}$, skew code$_{303}$, and time code$_{303}$, and the minimum of the period of the clock signal on bonding pad 301 and the period of the clock signal on bonding pad 303 (1018). Note that in other embodiments, steps 1010-1016 are performed before steps 1002-1008. Other embodiments may use a different order that does not affect data dependencies to perform the steps illustrated in FIG. 12.

Figure 13:
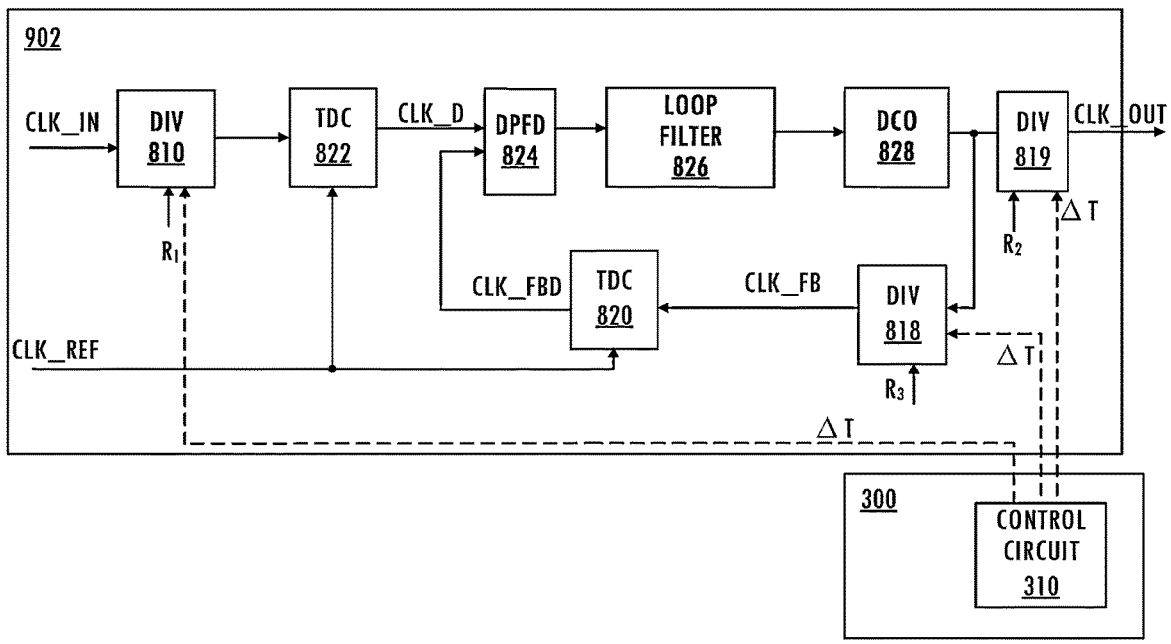
FIG. 13 illustrates a functional block diagram of an exemplary clock generator circuit configured to adjust the delay between an input clock signal and an output clock signal based on a delay measurement consistent with at least one embodiment of the invention.

In at least one embodiment of an integrated circuit product, control circuit 310 uses the delay to calibrate a clock signal derived from a clock signal received by bonding pad 301 or a clock signal received by bonding pad 303 (1020). For example, referring to FIG. 13, control circuit 310 uses the measured delay to provide phase adjustment ΔT to input frequency divider 810, feedback frequency divider 818, or output frequency divider 819 of clock generator 902, which receives clock signal CLK_IN that is derived from a clock signal received on bonding pad 301 and provides a clock signal derived from clock signal CLK_OUT to bonding pad 303. In other embodiments, phase adjustment ΔT is introduced at digital phase/frequency detector 824, loop filter 826, or digitally controlled oscillator 828.

Figure 14:
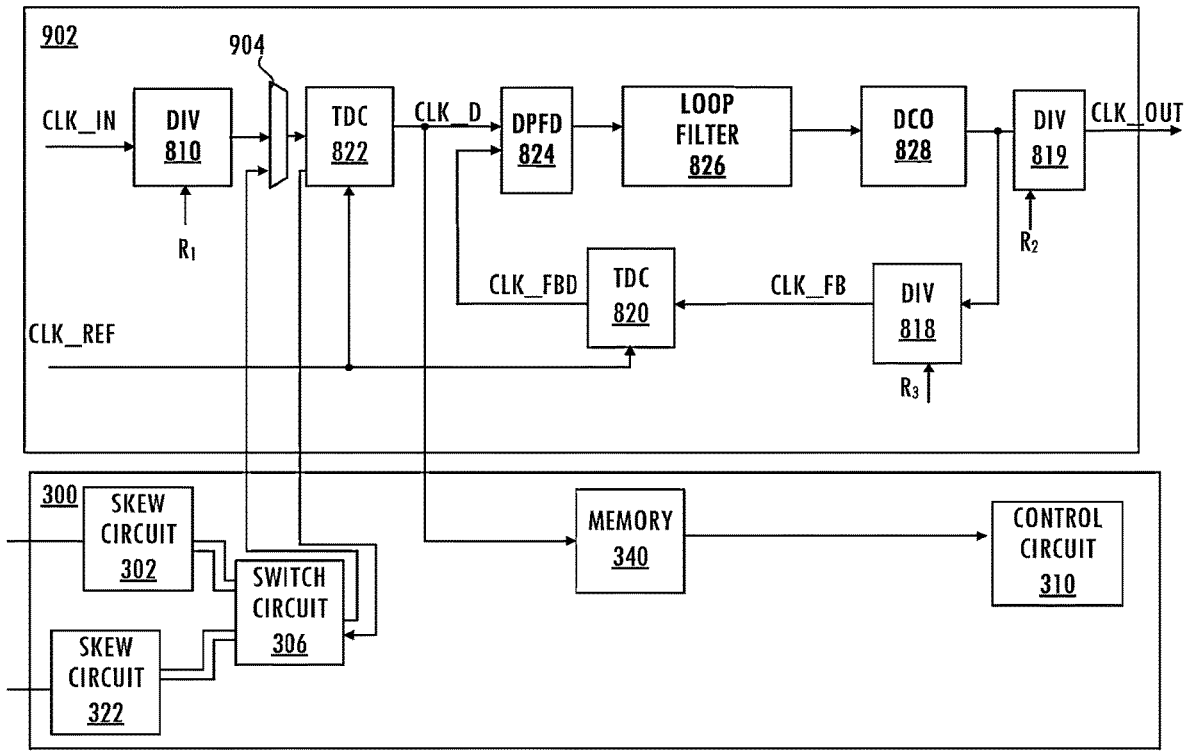
FIG. 14 illustrates a functional block diagram of an exemplary delay measurement circuit using a time-to-digital converter of a clock generator circuit consistent with at least one embodiment of the invention.

In at least one embodiment of an integrated circuit product, the delay measurement technique shares hardware of a clock product with another function of the clock product. Referring to FIG. 14, in some embodiments, time-to-digital converter circuit 822 is shared between delay measurement circuit 300 and clock generator 902, which operates during a target application separately from a mode of operation for estimating the delay between pins of the integrated circuit product. For example, time-to-digital converter circuit 822 of clock generator 902 is used in delay measurement circuit 300 in a delay estimation mode of the integrated circuit product and also used by a phase-locked loop of clock generator 902 during a clock generation mode of operation of the integrated circuit product. The delay measurement may be repeated periodically to capture delay variations due to aging or temperature variations. In other embodiments, select circuit 904 is located at the input of time-to-digital converter circuit 820 and time-to-digital converter circuit 820 is shared between delay measurement circuit 300 and clock generator 902.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium. The tangible computer-readable media may store instructions as well as data that can be used to implement the invention. The instructions/data may be related to hardware, software, firmware or combinations thereof.

Thus, techniques for estimating pin-to-pin delays are disclosed. The description of the invention set forth herein is illustrative and is not intended to limit the scope of the invention as set forth in the following claims. For example, while the invention has been described in an embodiment in which pin-to-pin delays are measured, one of skill in the art will appreciate that the teachings herein can be utilized with measurements of delays between nodes internal to an integrated circuit product. Variations and modifications of the embodiments disclosed herein may be made based on the description set forth herein, without departing from the scope of the invention as set forth in the following claims.

What is claimed is:

1. A delay measurement circuit comprising:
a plurality of skew circuits;
a time measurement circuit configured to output a signal edge in a first mode; and
a plurality of pairs of matched conductive traces, each pair coupling a respective skew circuit of the plurality of skew circuits to the time measurement circuit, each respective skew circuit configured in the first mode to receive the signal edge on a first trace of its pair of matched conductive traces from the time measurement circuit and to directly return the signal edge to the time measurement circuit on a second trace of the pair irrespective of any signal received on a bonding pad coupled to the respective skew circuit, such that the first trace and the second trace form a loop between the time measurement circuit and the respective skew circuit in the first mode, and further configured in a second mode to pass a signal edge to the time measurement circuit on the second trace of the pair synchronous with a clock signal received on the bonding pad.

2. The delay measurement circuit of claim 1 wherein in the second mode of operation the signal edge is received from the time measurement circuit on one trace of the pair and returned to the time measurement circuit on the other trace of the pair synchronous with the clock signal.

3. The delay measurement circuit of claim 1 wherein the time measurement circuit includes a time-to-digital converter.

4. The delay measurement circuit as recited in claim 1 wherein each respective skew circuit includes:
a state element having a data input coupled to a first conductive trace of the pair of matched conductive traces coupled to the respective skew circuit and a control terminal coupled to the bonding pad that is coupled to the respective skew circuit; and
a select circuit configured, in response to a control signal, to selectively couple either an output of the state element or the first conductive trace to a second conductive trace of the pair of matched conductive traces.

5. The delay measurement circuit of claim 1 further comprising a switch circuit configured to selectively couple the time measurement circuit to each respective skew circuit of the plurality of skew circuits via the pair of matched conductive traces coupled to the respective skew circuit.

6. The delay measurement circuit of claim 1 wherein the time measurement circuit is configurable in the first mode of operation to measure relative time difference and in the second mode of operation to perform absolute time measurement.

7. The delay measurement circuit of claim 1 wherein the time measurement circuit is shared with a clock generator.

8. The delay measurement circuit of claim 1 further comprising a control circuit configured to use one or more delays measured by the delay measurement circuit to control operation of a clock generator.

9. A clock product comprising:
a clock generator; and
a delay measurement circuit including a plurality of skew circuits, a time measurement circuit configured to output a signal edge in a first mode, and a plurality of pairs of matched conductive traces each coupling a respective skew circuit of the plurality of skew circuits to the time measurement circuit, each respective skew circuit configured in the first mode to receive the signal edge on a first trace of its pair of matched conductive traces from the time measurement circuit and to directly return the signal edge to the time measurement circuit on a second trace of the pair irrespective of any signal received on a bonding pad coupled to the respective skew circuit, such that the first trace and the second trace form a loop between the time measurement circuit and the respective skew circuit in the first mode, and further configured in a second mode to pass a signal edge to the time measurement circuit on the second trace of the pair synchronous with a clock signal received on the bonding pad.

10. The clock product of claim 9 wherein in the second mode of operation the signal edge is received from the time measurement circuit on one trace of the pair and returned to the time measurement circuit on the other trace of the pair synchronous with the clock signal.

11. The clock product of claim 9 further comprising a control circuit that uses one or more delays measured by the delay measurement circuit to control operation of the clock generator.

12. The clock product of claim 9 wherein the clock generator and the delay measurement circuit share the time measurement circuit.

13. The clock product of claim 9 wherein the delay measurement circuit further includes a switch circuit configured to selectively couple the time measurement circuit to each respective skew circuit of the plurality of skew circuits via the pair of matched conductive traces coupled to the respective skew circuit.

14. The clock product of claim 9 wherein the time measurement circuit includes a time-to-digital converter.

15. The clock product of claim 9 wherein the time measurement circuit is configurable in the first mode of operation to measure relative time difference and in the second mode of operation to perform absolute time measurement.

16. A method of operating a clock circuit, comprising:
operating a first skew circuit in a first mode to receive a first signal edge output by a time measurement circuit on a first trace of a first pair of conductive traces that couples the first skew circuit to the time measurement circuit, and to directly return the first signal edge to the time measurement circuit on a second trace of the first pair of conductive traces irrespective of any signal received on a first bonding pad coupled to the first skew circuit, such that the first trace and the second trace form a loop between the time measurement circuit and the first skew circuit in the first mode;
operating the first skew circuit in a second mode to pass a second signal edge to the time measurement circuit on the second trace of the first pair of conductive traces synchronous with a first clock signal received on the first bonding pad;
operating a second skew circuit in the first mode to receive a third signal edge output by the time measurement circuit, on a first trace of a second pair of conductive traces that couples the second skew circuit to the time measurement circuit, and to directly return the third signal edge to the time measurement circuit on a second trace of the second pair of conductive traces irrespective of any signal received on a second bonding pad coupled to the second skew circuit, such that the first trace and the second trace form a loop between the time measurement circuit and the second skew circuit in the first mode; and
operating the second skew circuit in a second mode to pass a fourth signal edge to the time measurement circuit on the second trace of the second pair of conductive traces synchronous with a second clock signal received on the second bonding pad.

17. The method of claim 16 further comprising switching between selectively coupling the first skew circuit to the time measurement circuit and selectively coupling the second skew circuit to the time measurement circuit.

18. The method of claim 16 wherein the time measurement circuit includes a time-to-digital converter.

19. The method of claim 16 further comprising calculating one or more calculated delays using values measured during the operating of the first skew circuit in the first mode and in the second mode, and during the operating of the second skew circuit in the first mode and in the second mode.

20. The method of claim 19 further comprising controlling a clock generator based on the one or more calculated delays.

* * * * *